(12) United States Patent
Hirata et al.

(10) Patent No.: US 12,211,729 B2
(45) Date of Patent: Jan. 28, 2025

(54) MEMBER FOR SEMICONDUCTOR MANUFACTURING APPARATUS

(71) Applicant: NGK INSULATORS, LTD., Nagoya (JP)

(72) Inventors: Natsuki Hirata, Nagoya (JP); Shinya Yoshida, Nagoya (JP); Tatsuya Kuno, Nagoya (JP); Seiya Inoue, Handa (JP); Taro Usami, Kakamigahara (JP); Kenji Yonemoto, Tokoname (JP); Aoi Saito, Mihama-Town (JP)

(73) Assignee: NGK INSULATORS, LTD., Nagoya (JP)

( * ) Notice: Subject to any disclaimer, the term of this patent is extended or adjusted under 35 U.S.C. 154(b) by 3 days.

(21) Appl. No.: 18/346,951

(22) Filed: Jul. 5, 2023

(65) Prior Publication Data

US 2024/0186170 A1    Jun. 6, 2024

Related U.S. Application Data

(63) Continuation of application No. PCT/JP2022/044764, filed on Dec. 5, 2022.

(51) Int. Cl.
*H01L 21/683* (2006.01)

(52) U.S. Cl.
CPC ................ *H01L 21/6833* (2013.01)

(58) Field of Classification Search
CPC .......... H01L 21/6833; H01L 21/67103; H01L 21/67109; H01L 21/6831; H01L 21/68757; H01L 21/68785
See application file for complete search history.

(56) References Cited

U.S. PATENT DOCUMENTS

| 5,720,818 A | 2/1998 | Donde et al. |
| 2019/0035667 A1 | 1/2019 | Minemura |

(Continued)

FOREIGN PATENT DOCUMENTS

| JP | H10-050813 A | 2/1998 |
| JP | 2018-101773 A | 6/2018 |

(Continued)

OTHER PUBLICATIONS

International Search Report and Written Opinion (Application No. PCT/JP2022/044764) dated Jan. 31, 2023 (6 pages).

(Continued)

*Primary Examiner* — Andrew D Perreault
(74) *Attorney, Agent, or Firm* — BURR PATENT LAW, PLLC

(57) ABSTRACT

A member for a semiconductor manufacturing apparatus includes: a ceramic plate that has a wafer placement surface at an upper surface thereof; a plug disposition hole that extends through the ceramic plate in an up-down direction and that has a truncated conical space whose upper opening is larger than a lower opening thereof; a truncated conical plug that is disposed in the plug disposition hole, that allows gas to flow in the up-down direction, and whose upper surface is larger than a lower surface thereof; an adhesive layer that is provided between the plug disposition hole and the truncated conical plug; an electrically conductive baseplate that is joined to a lower surface of the ceramic plate through a joint layer; and a gas supply path that is provided in the baseplate and the joint layer and that supplies gas to the truncated conical plug.

5 Claims, 4 Drawing Sheets

(56) References Cited

U.S. PATENT DOCUMENTS

| | | |
|---|---|---|
| 2020/0294838 A1 | 9/2020 | Yoshikawa et al. |
| 2020/0411355 A1 | 12/2020 | Noorbakhsh et al. |
| 2022/0216086 A1 | 7/2022 | Ishikawa et al. |

FOREIGN PATENT DOCUMENTS

| | | |
|---|---|---|
| JP | 2019-029384 A | 2/2019 |
| JP | 2021-044307 A | 3/2021 |
| JP | 2022-106181 A | 7/2022 |
| KR | 10-2020-0109253 A | 9/2020 |

OTHER PUBLICATIONS

Korean Office Action (with English translation) dated Sep. 19, 2024 (Application No. 10-2023-7023090).

MEMBER FOR SEMICONDUCTOR MANUFACTURING APPARATUS

BACKGROUND OF THE INVENTION

1. Field of the Invention

The present invention relates to a member for a semiconductor manufacturing apparatus.

2. Description of the Related Art

Hitherto, as a member for a semiconductor manufacturing apparatus, a member including an electrostatic chuck having a wafer placement surface at its upper surface has been known. For example, an electrostatic chuck in Patent Literature 1 is one in which a truncated conical porous plug is inserted into and fixed with an adhesive to a bottomed recessed portion of a truncated conical space provided in a lower surface of a ceramic plate, and the lower surface of the ceramic plate and a metallic baseplate are joined to each other. An electrostatic chuck in Patent Literature 2 is one in which, by sintering, a columnar porous plug is integrated with a through hole of a columnar space formed in a ceramic plate, and a lower surface of the ceramic plate and a metallic baseplate are joined to each other.

CITATION LIST

Patent Literature

PTL 1: Japanese Unexamined Patent Application Publication No. 2018-101773
PTL 2: Japanese Unexamined Patent Application Publication No. 2019-29384

SUMMARY OF THE INVENTION

However, in the electrostatic chuck in Patent Literature 1, since the bottomed recessed portion that accommodates the porous plug is provided in the lower surface of the ceramic plate, there is a problem in that when the porous plug needs to be replaced, the porous plug cannot be easily replaced. In the electrostatic chuck in Patent Literature 2, since the porous plug is integrated with the through hole by sintering, there is a problem in that when the porous plug needs to be replaced, the porous plug likewise cannot be easily replaced. Here, in the electrostatic chuck in Patent Literature 2, the columnar porous plug may be fixed to the through hole of the columnar space by using an adhesive instead of by sintering. However, since the adhesive tends to flow down at the time of the adhesion, air bubbles that extend so as to be long in an up-down direction tend to be produced inside the adhesive. When such air bubbles are produced, electric discharge occurs inside the air bubbles when a wafer is processed with plasma, and thus a rear surface of the wafer may become burned.

The present invention has been made to overcome such a problem, and it is a primary object of the present invention to make it possible to easily replace a plug that allows gas to flow in an up-down direction, and to make it unlikely for electric discharge to occur in the vicinity of the plug.

[1] A member for a semiconductor manufacturing apparatus of the present invention includes: a ceramic plate that has a wafer placement surface at an upper surface thereof; a plug disposition hole that extends through the ceramic plate in an up-down direction and that has a truncated conical space whose upper opening has an area that is larger than an area of a lower opening thereof; a truncated conical plug that is disposed in the plug disposition hole, that allows gas to flow in the up-down direction, and whose upper surface has an area that is larger than an area of a lower surface thereof; an adhesive layer that is provided between an inner peripheral surface of the plug disposition hole and an outer peripheral surface of the truncated conical plug; an electrically conductive baseplate that is joined to a lower surface of the ceramic plate through a joint layer; and a gas supply path that is provided in the baseplate and the joint layer and that supplies gas to the truncated conical plug.

In the member for a semiconductor manufacturing apparatus, when the plug needs to be replaced, the plug can be pulled out upward from the plug disposition hole of the ceramic plate by cutting, fusing, or softening the adhesive layer. A new plug can be adhered to the plug disposition hole by inserting the new plug from above the plug disposition hole. Therefore, the plug can be easily replaced. When an adhesive layer is to be provided between the inner peripheral surface of the plug disposition hole and the outer peripheral surface of the plug, since these surfaces are tapering surfaces, the adhesive is unlikely to flow down. Therefore, compared with when these surfaces are perpendicular surfaces, air bubbles (air bubbles of a size at which electric discharge occurs when a wafer is processed with plasma) are unlikely to be produced in the adhesive layer. Consequently, electric discharge is unlikely to occur in the vicinity of the plug (the adhesive layer) when a wafer is processed with plasma.

Note that, in the present description, the present invention is described by using terms, such as up, down, left, right, front, and rear. However, up, down, left, right, front, and rear merely refer to relative positional relationships. Therefore, when the orientation of a member for a semiconductor manufacturing apparatus is changed, up and down may become left and right, or left and right may become up and down. Accordingly, such cases are also included in the technical scope of the present invention.

[2] In the member for a semiconductor manufacturing apparatus described above (the member for a semiconductor manufacturing apparatus according to [1] above), a space that allows entry of the truncated conical plug may be provided at a position of the gas supply path opposite to the truncated conical plug. If this is the case, when disposing the plug in the plug disposition hole, even if there is a manufacturing error in the plug disposition hole or the plug, such a manufacturing error can be absorbed by the space that allows entry of the plug.

[3] In the member for a semiconductor manufacturing apparatus described above (the member for a semiconductor manufacturing apparatus according to [1] or [2] above), it is preferable that an elevation angle of the inner peripheral surface of the plug disposition hole and an elevation angle of the outer peripheral surface of the truncated conical plug be 55 degrees or more and 85 degrees or less. If this is the case, since, when providing an adhesive layer between the inner peripheral surface of the plug disposition hole and the outer peripheral surface of the plug, the adhesive is likely to spread uniformly, no air bubbles or almost no air bubbles are produced in the adhesive layer. Therefore, the effect of preventing electric discharge in the vicinity of the plug (the adhesive layer) is increased.

[4] In the member for a semiconductor manufacturing apparatus described above (the member for a semiconductor manufacturing apparatus according to any one of [1] to [3] above), it is preferable that the adhesive layer not have an air bubble whose maximum length in the up-down direction exceeds 0.2 mm. When the maximum length in the up-down direction of the air bubble exceeds 0.2 mm, electric discharge may occur inside the air bubble when a wafer is processed with plasma, whereas, when the maximum length in the up-down direction of the air bubble does not exceed 0.2 mm, there is no possibility or almost no possibility of electric discharge occurring inside the air bubble.

[5] In the member for a semiconductor manufacturing apparatus described above (the member for a semiconductor manufacturing apparatus according to any one of [1] to [4] above), it is preferable that the adhesive layer not have an air bubble. If this is the case, the effect of preventing electric discharge in the vicinity of the plug (the adhesive layer) is increased.

DETAILED DESCRIPTION OF THE INVENTION

Figure 1:
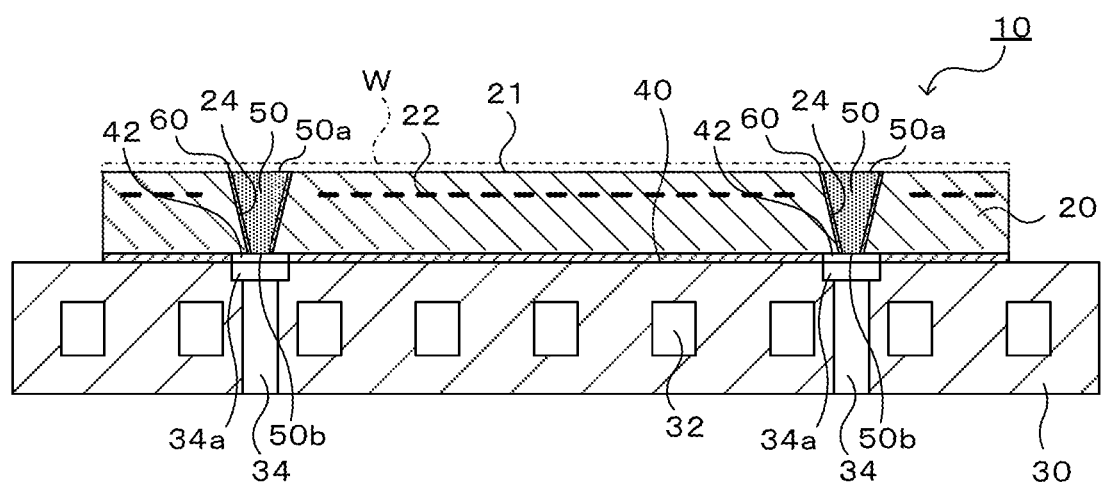
FIG. 1 is a vertical cross-sectional view of a member 10 for a semiconductor manufacturing apparatus.
Figure 2:
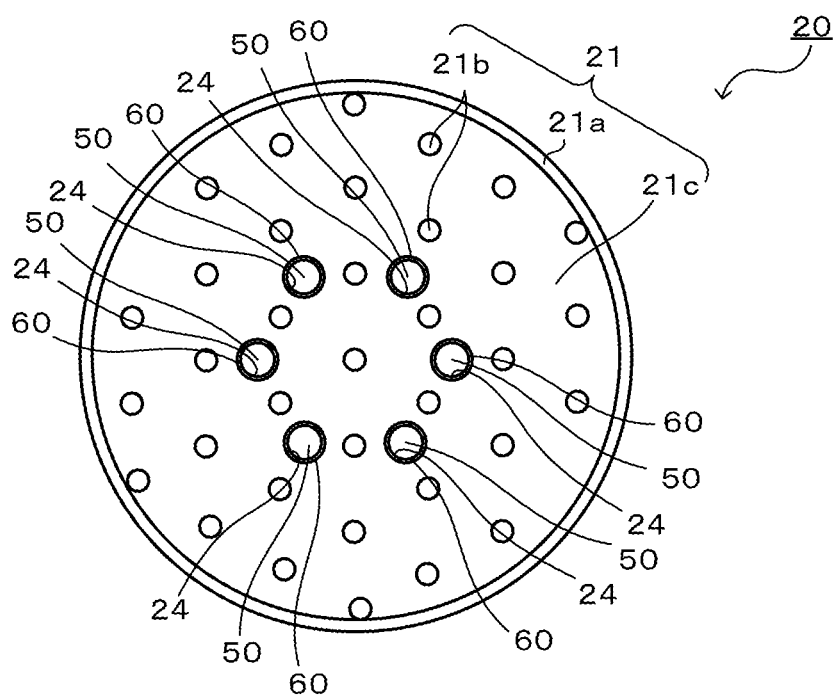
FIG. 2 is a plan view of a ceramic plate 20.
Figure 3:
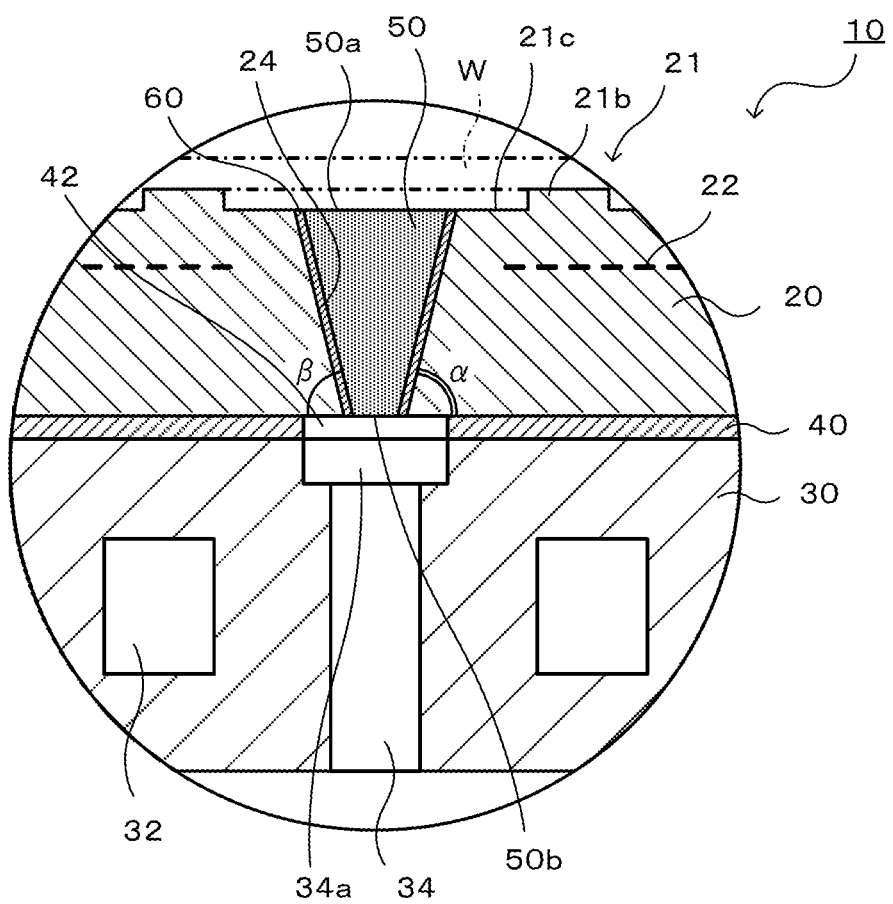
FIG. 3 is a partial enlarged view of FIG. 1.

A preferred embodiment of the present invention will now be described with reference to the drawings. FIG. 1 illustrates a vertical cross-sectional view of a member 10 for semiconductor manufacturing apparatus. FIG. 2 illustrates a plan view of a ceramic plate 20. FIG. 3 illustrates a partial enlarged view of a part of FIG. 1.

A member 10 for a semiconductor manufacturing apparatus includes a ceramic plate 20, plug disposition holes 24, a baseplate 30, a metal joint layer 40, and porous plugs 50.

The ceramic plate 20 is a ceramic disk (having, for example, a diameter of 300 mm and a thickness of 5 mm) such as an alumina sintered body or an aluminum nitride sintered body. An upper surface of the ceramic plate 20 is a wafer placement surface 21. The ceramic plate 20 contains an electrode 22. As illustrated in FIG. 2, a seal band 21a is formed on the wafer placement surface 21 of the ceramic plate 20 along an outer edge, and multiple circular small projections 21b are formed on the entire surface. The seal band 21a and the circular small projections 21b have the same height, and the height thereof is, for example, several μm to several tens of μm. The electrode 22 is a mesh electrode that is used as an electrostatic electrode and that has a flat plate shape, and a direct voltage can be applied thereto. When the direct voltage is applied to the electrode 22, a wafer W is attracted and secured to the wafer placement surface 21 (specifically, an upper surface of the seal band 21a and upper surfaces of the circular small projections 21b) due to electrostatic attraction force. When applying the direct voltage ends, the wafer W that is attracted and secured to the wafer placement surface 21 is released. A portion of the wafer placement surface 21 on which the seal band 21a and the circular small projections 21b are not formed is referred to as a reference surface 21c.

Each plug disposition hole 24 is a through hole that extends through the ceramic plate 20 in an up-down direction, and is opposite to a gas hole 34 corresponding thereto of the baseplate 30. Although each plug disposition hole 24 extends through an electrode 22 in the up-down direction, the electrode 22 is not exposed to an inner peripheral surface of each plug disposition hole 24. Each plug disposition hole 24 is a tapering hole having a truncated conical space whose upper opening has an area that is larger than the area of its lower opening. An elevation angle α (FIG. 3) of the inner peripheral surface of each plug disposition hole 24 is preferably 55 degrees or more and 85 degrees or less and is more preferably 65 degrees or more and 85 degrees or less. As shown in FIG. 2, the plug disposition holes 24 are provided in a plurality of locations (for example, a plurality of locations at equal intervals in a peripheral direction) of the ceramic plate 20.

The baseplate 30 is a disk having good thermal conductivity (a disk having a diameter that is the same as or larger than the diameter of the ceramic plate 20). A refrigerant flow path 32 in which refrigerant (for example, an electrically insulating liquid such as a fluorine-based inert liquid) circulates and the gas holes 34 that supply gas to the porous plugs 50 are formed inside the baseplate 30. Each gas hole 34 is provided so as to extend through the baseplate 30 in the up-down direction, and has a large-diameter portion 34a at its upper portion. Each large-diameter portion 34a includes the lower opening of a corresponding one of the plug dispositions holes 24 in plan view. The refrigerant flow path 32 is formed in a one-stroke pattern from an inlet to an outlet over the entire surface of the baseplate 30 in plan view. An example of a material of the baseplate 30 is a composite material or a metal. An example of the composite material is a composite material of metal and ceramic, or the like. Examples of the composite material of metal and ceramic are a metal matrix composite material (MMC), a ceramic matrix composite material (CMC), and the like. Specific examples of such a composite material are a material containing Si, SiC, and Ti, a material in which Al and/or Si is impregnated in a SiC porous body, and the like. A material containing Si, SiC, and Ti is referred to as SisiCTi, a material in which Al is impregnated in a SiC porous body is referred to as AlsiC, and a material in which Si is impregnated in a SiC porous body is referred to as SiSiC. An example of the metal is Mo or the like. As the material of the baseplate 30, it is preferable to select a material having a coefficient of thermal expansion that is close to the coefficient of thermal expansion of a material of the ceramic plate 20. The baseplate 30 is used as an RF electrode. Specifically, an upper electrode (not shown) is disposed above a wafer placement surface 21, and when a high-frequency electric power is applied between parallel plate electrodes corresponding to the upper electrode and the baseplate 30, plasma is produced.

The metal joint layer 40 joins a lower surface of the ceramic plate 20 and an upper surface of the baseplate 30. The metal joint layer 40 is formed by, for example, TCB (thermal compression bonding). TCB refers to a publicly known method of interposing a metal joint material between two members to be joined, and pressing and joining the two members while being heated at a temperature lower than or equal to a solidus temperature of the metal joint material. The metal joint layer 40 may be a solder layer or a brazing metal layer. The metal joint layer 40 has through holes 42. Each through hole 42 is provided at a position that is opposite to the large-diameter portion 34a of a corresponding one of the gas holes 34. Each through hole 42 is provided coaxially with the corresponding one of the large-diameter portions 34a, and the diameter of each through hole 42 is the same as the diameter of the corresponding one of the large-diameter portions 34a. "The same" in the present description encompasses in addition to exactly the same, substantially the same (for example, the case within the range of tolerance) (hereunder the same). Note that the gas holes 34 and the through holes 42 each correspond to a gas supply path of the present invention.

Each porous plug 50 is fixed to a corresponding one of the plug disposition holes 24. Each porous plug 50 is an electrically insulating member that allows gas to flow in the up-down direction. The porosity of each porous plug 50 is preferably 30% or greater, and the average pore size is preferably 20 μm or greater. Each porous plug 50 is a truncated conical member whose upper surface has an area that is larger than the area of its lower surface. An elevation angle β of an outer peripheral surface of each porous plug 50 is the same as the elevation angle α of the inner peripheral surface of each plug disposition hole 24. An adhesive layer 60 is provided between the outer peripheral surface of each porous plug 50 and the inner peripheral surface of the corresponding one of the plug disposition holes 24. The adhesive layer 60 does not have air bubbles of a size at which electric discharge occurs when a wafer W is processed with plasma (for example, air bubbles having a height in the up-down direction that is greater than or equal to 2 mm). Examples of a material of the adhesive layer 60 include acrylic resin, silicone resin, and epoxy resin. An example of a material of each porous plug 50 is ceramic, and, specifically, a porous body made of a material that is the same as the material of the ceramic plate 20 can be used. An upper surface 50a of each porous plug 50 is exposed to the upper opening of a corresponding one of the plug disposition holes 24, and is flush with the reference surface 21c. "The same" in the present description encompasses in addition to exactly the same, substantially the same (for example, the case within the range of tolerance) (hereunder the same). A lower surface 50b of each porous plug 50 is exposed to the lower opening of the corresponding one of the plug disposition holes 24.

Next, An example of the use of the member 10 for semiconductor manufacturing apparatus thus configured will now be described. The wafer W is first placed on the wafer placement surface 21 with the member 10 for semiconductor manufacturing apparatus installed in a chamber not illustrated. The pressure of the chamber is decompressed by a vacuum pump and is adjusted such that a predetermined degree of vacuum is achieved. A direct voltage is applied to the electrode 22 of the ceramic plate 20 to generate electrostatic attraction force, and the wafer W is attracted and secured to the wafer placement surface 21 (specifically, the upper surface of the seal band 21a and the upper surfaces of the circular small projections 21b). Subsequently, a reactive gas atmosphere at a predetermined pressure (for example, several tens of Pa to several hundreds of Pa) is created in the chamber. In this state, a high-frequency voltage is applied between an upper electrode, not illustrated, on a ceiling portion in the chamber and the base plate 30 of the member 10 for semiconductor manufacturing apparatus, and plasma is generated. The surface of the wafer W is processed by the generated plasma. The refrigerant circulates through the refrigerant flow path 32 of the base plate 30. Backside gas is introduced into the gas holes 34 from a gas tank not illustrated. Heat conduction gas (such as helium) is used as the backside gas. The backside gas passes through the gas holes 34, through holes 42, and the porous plugs 50, is supplied to a space between the back surface of the wafer W and the reference surface 21c of the wafer placement surface 21, and is sealed. The backside gas enables heat conduction between the wafer W and the ceramic plate 20 to be efficient.

Figure 4A:
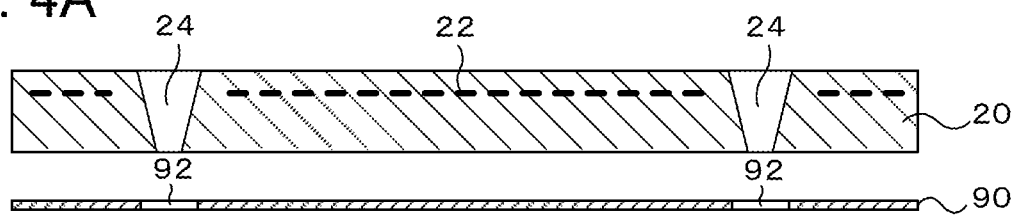
FIGS. 4A to 4C show the steps of manufacturing the member 10 for a semiconductor manufacturing apparatus.
Figure 4B:
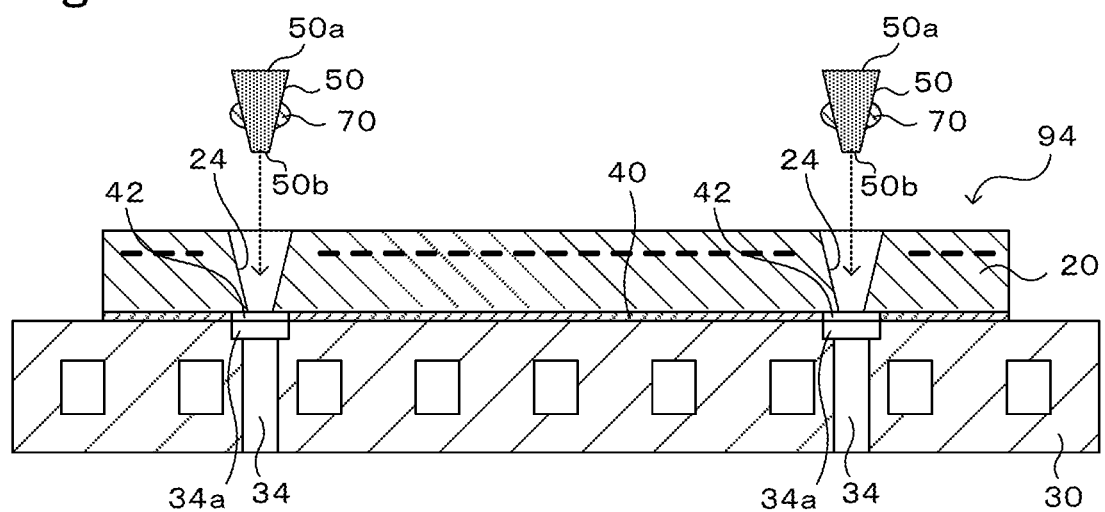
Figure 4C:
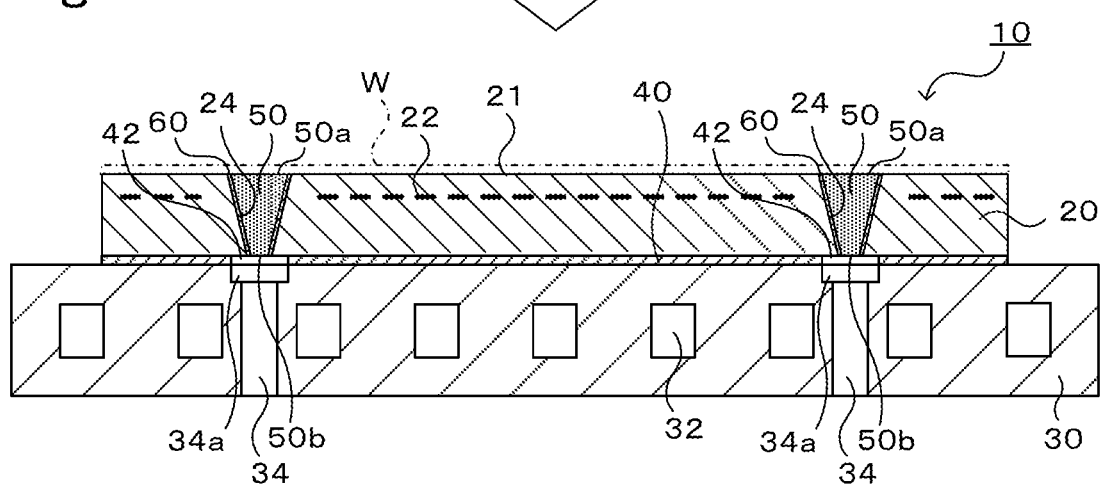

Next, an example of manufacturing the member 10 for a semiconductor manufacturing apparatus is described based on FIGS. 4A to 4C. FIGS. 4A to 4C show the steps of manufacturing the member 10 for a semiconductor manufacturing apparatus. First, a ceramic plate 20, a baseplate 30, and a metal joint material 90 are prepared (FIG. 4A). The ceramic plate 20 has an electrode 22 built therein, and has plug disposition holes 24. The baseplate 30 has a refrigerant flow path 32 and gas holes 34. Each gas hole 34 has a large-diameter portion 34a at its upper portion. The metal joint material 90 has through holes 92 at positions that are opposite to the large-diameter portions 34a of the respective gas holes 34.

Next, the metal joint material 90 is interposed between a lower surface of the ceramic plate 20 and an upper surface of the baseplate 30 to form a layered body. At this time, the plug disposition holes 24 of the ceramic plate 20, the through holes 92 of the metal joint material 90, and the gas holes 34 of the baseplate 30 are placed upon each other so as to be coaxial with each other. Then, the layered body is pressed and joined at a temperature less than or equal to a solidus temperature of the metal joint material 90 (greater than or equal to a temperature obtained by subtracting 20° C. from the solidus temperature and less than or equal to the solidus temperature), after which the temperature is returned to room temperature (TCB). Therefore, the metal joint material 90 becomes a metal joint layer 40 and the through holes 92 become through holes 42, as a result of which a joint body 94 obtained by joining the ceramic plate 20 and the baseplate 30 by the metal joint layer 40 can be obtained (FIG. 4B). Note that, as the metal joint material 90, an Al—Mg based joint material or an Al—Si—Mg based joint material can be used. The metal joint material 90 is preferably one having a thickness of about 100 μm.

Next, truncated conical porous plugs 50 are prepared (FIG. 4B). The height of each porous plug 50 is the same as the depth of each plug disposition hole 24 (that is, the height of the ceramic plate 20), which is a truncated conical space. An adhesive 70 is applied at least once around an outer peripheral surface of each porous plug 50 in a peripheral direction. The adhesive 70 may be an organic adhesive or an inorganic adhesive. Each porous plug 50 to which the adhesive 70 has been applied is inserted into a corresponding one of the plug disposition holes 24. At this time, each porous plug 50 is turned or moved up and down such that the adhesive 70 spreads along the outer peripheral surfaces of the porous plugs 50 and inner peripheral surfaces of the respective plug disposition holes 24. Therefore, the adhesive 70 is uniformly spread such that air bubbles do not get caught in a gap between the outer peripheral surface of each porous plug 50 and the inner peripheral surface of the corresponding one of the plug disposition holes 24.

When each porous plug 50 is inserted into the corresponding one of the plug disposition holes 24, the outer peripheral surface of each porous plug 50 and the inner peripheral surface of the corresponding one of the plug disposition holes 24 are brought together through the adhesive 70. In this state, an upper surface of each porous plug 50 coincides with an upper surface (reference surface 21c) of the ceramic plate 20. For the porous plugs 50, a plurality of porous plugs having different heights are prepared. Therefore, in accordance with the actual height of the ceramic plate 20 (there are individual differences due to manufacturing errors), from among the plurality of prepared porous plugs 50 having different heights, porous plugs 50 whose upper surface coincides with the upper surface (reference surface 21c) of the ceramic plate 20 when the porous plugs 50 have been inserted into the respective plug disposition holes 24 are selected. Thereafter, when the adhesive 70 hardens and becomes an adhesive layer 60, the member 10 for a semiconductor manufacturing apparatus is obtained (FIG. 4C).

In the member 10 for a semiconductor manufacturing apparatus described in detail above, when a porous plug 50 needs to be replaced, the porous plug 50 can be pulled out upward from the corresponding plug disposition hole 24 by cutting, fusing, or softening the adhesive layer 60. A new porous plug 50 can be adhered to the plug disposition hole 24 by inserting the new porous plug 50 from above the plug disposition hole 24. Therefore, the porous plug 50 can be easily replaced.

When the adhesive layer 60 is to be provided between the inner peripheral surfaces of the plug disposition holes 24 and the outer peripheral surfaces of the respective porous plugs 50, since these surfaces are tapering surfaces, the adhesive 70 is unlikely to flow down. Therefore, compared with when these surfaces are perpendicular surfaces, air bubbles (air bubbles of a size at which electric discharge occurs when a wafer W is processed with plasma) are unlikely to be produced in the adhesive layer 60. Consequently, electric discharge is unlikely to occur in the vicinity of the porous plugs 50 (the adhesive layer 60) when a wafer W is processed with plasma.

Further, spaces (the through holes 42 and the large-diameter portions 34a) that allow entry of the porous plugs 50 are provided at positions of the gas holes 34 and positions of the through holes 42 opposite to the porous plugs, the gas holes 34 and the through holes 42 forming gas supply paths. Therefore, when disposing the porous plugs 50 in the respective plug disposition holes 24, even if there are manufacturing errors in the plug disposition holes 24 or the porous plugs 50, such manufacturing errors can be absorbed by the spaces that allow entry of the porous plugs 50. In contrast, when the plug disposition holes 24 each have a bottom surface, since the porous plugs 50 collide with the respective bottom surfaces, the manufacturing errors cannot be absorbed.

Further, the elevation angle α of the inner peripheral surface of each plug disposition hole 24 and the elevation angle β of the outer peripheral surface of each porous plug 50 are preferably the same, and are preferably 55 degrees or more and 85 degrees or less. If this is the case, when the adhesive layer 60 is to be provided between the inner peripheral surfaces of the plug disposition holes 24 and the outer peripheral surfaces of the respective porous plugs 50, the adhesive 70 is likely to spread uniformly. Therefore, no air bubbles or almost no air bubbles (air bubbles of a size at which electric discharge occurs when a wafer W is processed with plasma) are produced in the adhesive layer 60. Therefore, the effect of preventing electric discharge in the vicinity of the porous plugs 50 (the adhesive layer 60) is increased.

Although the adhesive layer 60 preferably does not have air bubbles, when the adhesive layer 60 has air bubbles, the maximum length of the air bubbles in an up-down direction is preferably 0.2 mm or less (that is, the adhesive layer 60 preferably does not have air bubbles whose maximum length in the up-down direction exceeds 0.2 mm). If this is the case, the effect of preventing electric discharge in the vicinity of the porous plugs 50 (the adhesive layer 60) is increased. For example, when a gas that flows in the gas supply paths is a helium gas, electrons produced due to ionization of helium at the time of the production of plasma accelerate and collide with another helium gas, as a result of which electric discharge (glow discharge) occurs. When the maximum length of the air bubbles in the up-down direction is 0.2 mm or less, since, inside the air bubbles, the electrons cannot be sufficiently accelerated, electric discharge can be suppressed.

As a result of bringing together the outer peripheral surface of each porous plug 50 and the inner peripheral surface of the corresponding one of plug disposition holes 24 through the adhesive 70, the height of the upper surface (reference surface 21c) of the ceramic plate 20 and the height of the upper surface of each porous plug 50 can be made to relatively easily coincide with each other.

The present invention is not limited to the above-described embodiment, and can be carried out by various modes as long as they belong to the technical scope of the invention.

Although, in the embodiment described above, the porous plugs 50 are described as examples of plugs that allow gas to flow in the up-down direction, the porous plugs 50 are not particularly limited thereto. For example, as such plugs, compact plugs having a flow path (for example, a spiral flow path) therein that allows gas to flow in the up-down direction may be used.

Although, in the embodiment described above, the height of the lower surface 50b of each porous plug 50 may be the same as the height of the lower surface of the ceramic plate 20 (the lower opening of each plug disposition hole 24), the height of the lower surface 50b of each porous plug 50 may be higher or lower than the height of the lower surface of the ceramic plate 20. In either case, the height of the upper surface 50a of each porous plug 50 is preferably the same as the height of the upper surface (reference surface 21c) of the ceramic plate 20.

Although, in the embodiment described above, each large-diameter portion 34a is provided at the upper portion of a corresponding one of the gas holes 34, the gas holes 34 are not particularly limited thereto. For example, the gas holes 34 may be straight holes, and their hole diameters may be made larger than the diameters of the lower openings of the plug disposition holes 24. Even in this case, upper portions of the through holes 42 of the metal joint layer 40 and the upper portions of the gas holes 34 become spaces that allow entry of the porous plugs 50.

Figure 5:
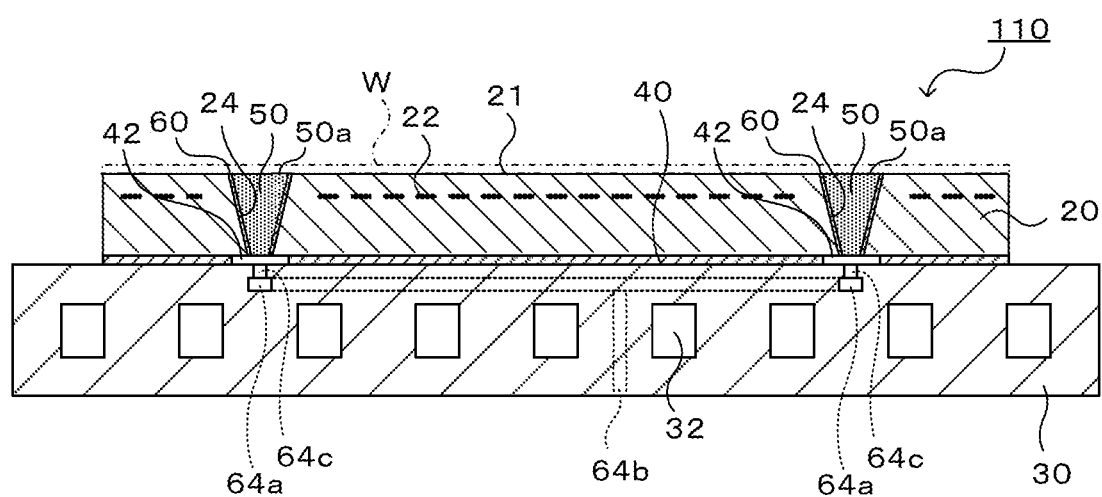
FIG. 5 is a vertical cross-sectional view of a member 110 for a semiconductor manufacturing apparatus.

Although, in the embodiment described above, the gas holes 34 that form gas supply paths are formed in the baseplate 30, the baseplate 30 is not limited thereto. For example, as in a member 110 for a semiconductor manufacturing apparatus shown in FIG. 5, a ring part 64a that is concentric with a baseplate 30 in plan view, an introduction part 64b that introduces a gas into the ring part 64a from a rear surface of the baseplate 30, and distribution parts 64c that distribute the gas to respective porous plugs 50 from the ring part 64a may be provided in the baseplate 30. In FIG. 5, structural elements that are the same as those of the embodiment described above are given the same reference numerals. The number of introduction parts 64b is less than the number of distribution parts 64c, and may be, for example, 1. If this is the case, the number of gas pipes that are connected to the baseplate 30 can be made less than the number of porous plugs 50.

Although, in the embodiment described above, as the electrode 22 that is built in the ceramic plate 20, an electrostatic electrode is used as an example, the electrode 22 is not particularly limited thereto. For example, in place of or in addition to the electrode 22, a heater electrode (resistance heating element) or an RF electrode may be built in the ceramic plate 20.

Although, in the embodiment described above, the ceramic plate 20 and the baseplate 30 are joined to each other by the metal joint layer 40, a resin adhesive layer may be used in place of the metal joint layer 40.

EXAMPLES

Experimental Example 1

A visible sample in which the member 10 for a semiconductor manufacturing apparatus described above was simulated was produced. Specifically, a ceramic plate 20 and a baseplate 30 were produced by using transparent acrylic resin, and both of the plates 20 and 30 were adhered to each other. As porous plugs 50, alumina porous bodies having a porosity of 30% were used. The elevation angle α of an inner peripheral surface of each plug disposition hole 24 and the elevation angle β of an outer peripheral surface of each porous plug 50 were 75 degrees. As an adhesive 70, a silicone adhesive having a viscosity of 40,000 cP was used. After applying the adhesive 70 at least once around the outer peripheral surface of each porous plug 50 in a peripheral direction, each porous plug 50 was inserted into a corresponding one of the plug disposition holes 24. At this time, each porous plug 50 was turned or moved up and down such that the adhesive 70 spreaded along the outer peripheral surface of each porous plug 50 and the inner peripheral surface of each plug disposition hole 24. Thereafter, as a result of hardening the adhesive 70, the visible sample was obtained. When an adhesive layer 60 of the visible sample was visually observed, air bubbles were not found. When a high-frequency voltage was applied to the visible sample, electric discharge did not occur in the vicinity of the porous plugs 50 (the adhesive layer 60).

Experimental Example 2

A visible sample was produced similarly to Experimental Example 1 except that the elevation angle of an outer peripheral surface of each porous plug 50 and the elevation angle of an inner peripheral surface of each plug disposition hole 24 were 85 degrees. When an adhesive layer 60 of the visible sample was visually observed, air bubbles were not found. When a high-frequency voltage was applied to the visible sample, electric discharge did not occur in the vicinity of the porous plugs 50 (the adhesive layer 60).

Experimental Example 3

A visible sample was produced similarly to Experimental Example 1 except that the elevation angle of an outer peripheral surface of each porous plug 50 and the elevation angle of an inner peripheral surface of each plug disposition hole 24 were 65 degrees. When an adhesive layer 60 of the visible sample was visually observed, air bubbles were not found. When a high-frequency voltage was applied to the visible sample, electric discharge did not occur in the vicinity of the porous plugs 50 (the adhesive layer 60).

Experimental Example 4

A visible sample was produced similarly to Experimental Example 1 except that the elevation angle of an outer peripheral surface of each porous plug 50 and the elevation angle of an inner peripheral surface of each plug disposition hole 24 were 55 degrees. When an adhesive layer 60 of the visible sample was visually observed, some air bubbles existed. When the details of these air bubbles were examined, air bubbles having a maximum length in an up-down direction that exceeded 0.2 mm were not found. When a high-frequency voltage was applied to the visible sample, electric discharge did not occur in the vicinity of the porous plugs 50 (the adhesive layer 60). Therefore, it was determined that the air bubbles were not large air bubbles causing electric discharge when processing a wafer W with plasma.

International Application No. PCT/JP2022/044764, filed on Dec. 5, 2022, is incorporated herein by reference in its entirety.

What is claimed is:

1. A member for a semiconductor manufacturing apparatus, the member comprising:
 a ceramic plate that has a wafer placement surface at an upper surface thereof;
 a plug disposition hole that extends through the ceramic plate in an up-down direction and that has a truncated conical space whose upper opening has an area that is larger than an area of a lower opening thereof;
 a truncated conical plug that is disposed in the plug disposition hole, that allows gas to flow in the up-down direction, and whose upper surface has an area that is larger than an area of a lower surface thereof;
 an adhesive layer that is provided between an inner peripheral surface of the plug disposition hole and an outer peripheral surface of the truncated conical plug;
 an electrically conductive baseplate that is joined to a lower surface of the ceramic plate through a joint layer; and
 a gas supply path that is provided in the baseplate and the joint layer and that supplies gas to the truncated conical plug.

2. The member for a semiconductor manufacturing apparatus according to claim 1,
 wherein a space that allows entry of the truncated conical plug is provided at a position of the gas supply path opposite to the truncated conical plug.

3. The member for a semiconductor manufacturing apparatus according to claim 1,
 wherein an elevation angle of the inner peripheral surface of the plug disposition hole and an elevation angle of the outer peripheral surface of the truncated conical plug are 55 degrees or more and 85 degrees or less.

4. The member for a semiconductor manufacturing apparatus according to claim 1,
 wherein the adhesive layer does not have an air bubble whose maximum length in the up-down direction exceeds 0.2 mm.

5. The member for a semiconductor manufacturing apparatus according to claim 1,
 wherein the adhesive layer does not have an air bubble.

* * * * *